United States Patent
Menon et al.

(10) Patent No.: US 10,833,391 B2
(45) Date of Patent: Nov. 10, 2020

(54) THERMAL MANAGEMENT METHOD AND APPARATUS FOR HIGH FREQUENCY IC WITH APERTURED HEAT SINK

(71) Applicant: Anokiwave, Inc., San Diego, CA (US)

(72) Inventors: Gaurav Menon, San Marcos, CA (US); Jonathan P. Comeau, San Diego, CA (US); Andrew Street, San Diego, CA (US); Scott Mitchell, San Diego, CA (US); Robert J. McMorrow, Concord, MA (US); Christopher Jones, San Diego, CA (US)

(73) Assignee: ANOKIWAVE, INC., San Diego, CA (US)

(*) Notice: Subject to any disclaimer, the term of this patent is extended or adjusted under 35 U.S.C. 154(b) by 122 days.

(21) Appl. No.: 16/153,556

(22) Filed: Oct. 5, 2018

(65) Prior Publication Data
US 2019/0109364 A1  Apr. 11, 2019

Related U.S. Application Data

(60) Provisional application No. 62/568,616, filed on Oct. 5, 2017.

(51) Int. Cl.
| | |
|---|---|
| *H01Q 1/02* | (2006.01) |
| *H01Q 17/00* | (2006.01) |
| *H01Q 1/40* | (2006.01) |
| *H01Q 3/40* | (2006.01) |
| *H01Q 15/24* | (2006.01) |
| *H01Q 21/06* | (2006.01) |
| *H01L 23/367* | (2006.01) |

(52) U.S. Cl.
CPC .............. *H01Q 1/02* (2013.01); *H01L 23/367* (2013.01); *H01Q 1/40* (2013.01); *H01Q 3/40* (2013.01); *H01Q 15/24* (2013.01); *H01Q 17/00* (2013.01); *H01Q 21/065* (2013.01); *H01L 2223/6677* (2013.01)

(58) Field of Classification Search
CPC ...... H01Q 1/02; H01Q 21/0025; H01L 23/34; H01L 23/36; H01L 23/367; H01L 23/3672; H01L 23/3675; H01L 23/3677; H01L 2223/6627; H01L 2223/6677
See application file for complete search history.

(56) References Cited

U.S. PATENT DOCUMENTS

| | | |
|---|---|---|
| 4,567,505 A | 1/1986 | Pease et al. |
| 7,852,281 B2 | 12/2010 | Choudhury |
| 7,859,835 B2 | 12/2010 | Puzella et al. |

OTHER PUBLICATIONS

International Search Report and Written Opinion for International Application No. PCT/US2018/054727, dated Feb. 8, 2019 (18 pages).

*Primary Examiner* — Robert Karacsony
(74) *Attorney, Agent, or Firm* — Nutter McClennen & Fish LLP

(57) ABSTRACT

An integrated circuit system has a die with first and second sides, and contains high frequency circuitry operating at mm-wave frequencies. The system also has a plurality of interfaces (on the first side) in electrical communication with the high frequency circuitry, and a heat sink having a bottom surface with a first region and an aperture region. The first region is in physical and conductive contact with the die, while the aperture region forms a concavity with an inner concave surface that is spaced from the die.

6 Claims, 7 Drawing Sheets

THERMAL MANAGEMENT METHOD AND APPARATUS FOR HIGH FREQUENCY IC WITH APERTURED HEAT SINK

PRIORITY

This patent application claims priority from provisional U.S. Patent Application No. 62/568,616, filed Oct. 5, 2017 entitled, "THERMAL MANAGEMENT METHOD AND APPARATUS FOR HIGH FREQUENCY IC WITH APERTURED HEAT SINK," and naming Gaurav Menon, Jonathan P. Comeau, Andrew Street, Scott Mitchell, Robert J. McMorrow, and Christopher Jones as inventors, the disclosure of which is incorporated herein, in its entirety, by reference.

FIELD OF THE INVENTION

Illustrative embodiments of invention generally relate to high-frequency phased array systems and, more particularly, illustrative embodiments relate to managing the thermal profile of a high-frequency integrated circuit in a phased array system.

BACKGROUND OF THE INVENTION

Antennas that emit electronically steered beams are known in the art as "phased array antennas." Such antennas are used worldwide in a wide variety of commercial and radar applications. They typically are produced from many small radiating elements that are individually phase controlled by high-frequency integrated circuits to form a beam in the far field of the antenna.

In a manner similar to other devices, integrated circuits that operate using high frequency signals (e.g., 10 gigahertz and larger) generally require heat sinks to manage their thermal profile. Undesirably, heat sinks can cause other problems that interfere with accurate formation of the beam.

SUMMARY OF VARIOUS EMBODIMENTS

In accordance with one embodiment of the invention, a phased array has a laminar substrate, a plurality of elements on the laminar substrate forming a patch phased array, and a plurality of integrated circuits on the laminar substrate. Each integrated circuit is a high frequency integrated circuit (operating at mm-wave frequencies, such as between 10 GHz and 90 GHz) configured to control receipt and/or transmission of signals by the plurality of elements in the patch phased array. In addition, each integrated circuit has a substrate side coupled with the laminar substrate, and a back side. The phased array also has a plurality of heat sinks.

Each integrated circuit is coupled with at least one of the heat sinks. A given heat sink of the plurality of heat sinks has a bottom surface in partial contact with a given back side of a given integrated circuit (of the plurality of integrated circuits). The bottom surface of the given heat sink has a first region and at least one aperture region. In preferred embodiments, the first region is in conductive thermal contact with the given back side of the given integrated circuit (e.g., in direct physical contact). Moreover, at least a portion of the aperture region is spaced from the given back side of the integrated circuit.

The aperture region preferably forms a concavity having an inner concavity surface that is spaced from the given back side. In other embodiments, the back side may have a first inner concavity, and a second concavity that also has a second inner concavity surface. The first and second inner concavity surfaces are spaced from the given back side.

The aperture region may form a concavity having any of a variety of shapes. For example, the concavity may have an elliptical shape, a non-elliptical shape, or an irregular shape. In contrast, the first region may be generally planar.

The phased array also may have a plurality of transmission lines on the laminar substrate. As such, each integrated circuit is physically coupled with a corresponding element by at least one of the plurality of transmission lines. Moreover, the plurality of elements may form a triangular lattice.

In accordance with another embodiment, a method of forming a phased array couples a plurality of integrated circuits to a laminar substrate having a patch array formed by a plurality of elements. Each integrated circuit is configured to control receipt and/or transmission of signals by the plurality of elements in the patch array, and is a high frequency integrated circuit operating at mm-wave frequencies. The method also provides a heat sink having a bottom surface with an aperture region that forms a concavity, and a first region. Next, the method couples the heat sink to a given integrated circuit of the plurality of integrated circuits. The first region of the heat sink is in thermally conductive contact with a given back side of the given integrated circuit.

In accordance with other embodiments of the invention, an integrated circuit system has a die with first and second sides, and contains high frequency circuitry operating at mm-wave frequencies. The system also has a plurality of interfaces (on the first side) in electrical communication with the high frequency circuitry, and a heat sink having a bottom surface with a first region and an aperture region. The first region is in physical and conductive contact with the die, while the aperture region forms a concavity with an inner concave surface that is spaced from the die.

A portion of the surface of the heat sink contacting the die may be generally flat with other types of concavities. For example, the concavity can include a rectangular concavity, a triangular concavity, lines forming patterns (e.g., intersecting lines, parallel lines, etc.), a plurality of holes of different shapes (e.g., circles, pentagons), irregular geometric shape, or other shapes and patterns. The heat sink thus may be patterned to improve isolation.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, an AESA system manages its thermal performance while mitigating potential cross-talk/interference caused by heat sinks used to dissipate heat. To that end, the AESA system has a specially configured heat sink with an aperture/concavity that mitigates the cross-talk/interference on the interfaces of its high frequency integrated circuits. Accordingly, the aperture/concavity effectively forms an electromagnetic barrier that significantly limits interference from the heat sink from impacting performance of the integrated circuits. Details of illustrative embodiments are discussed below.

Figure 1:
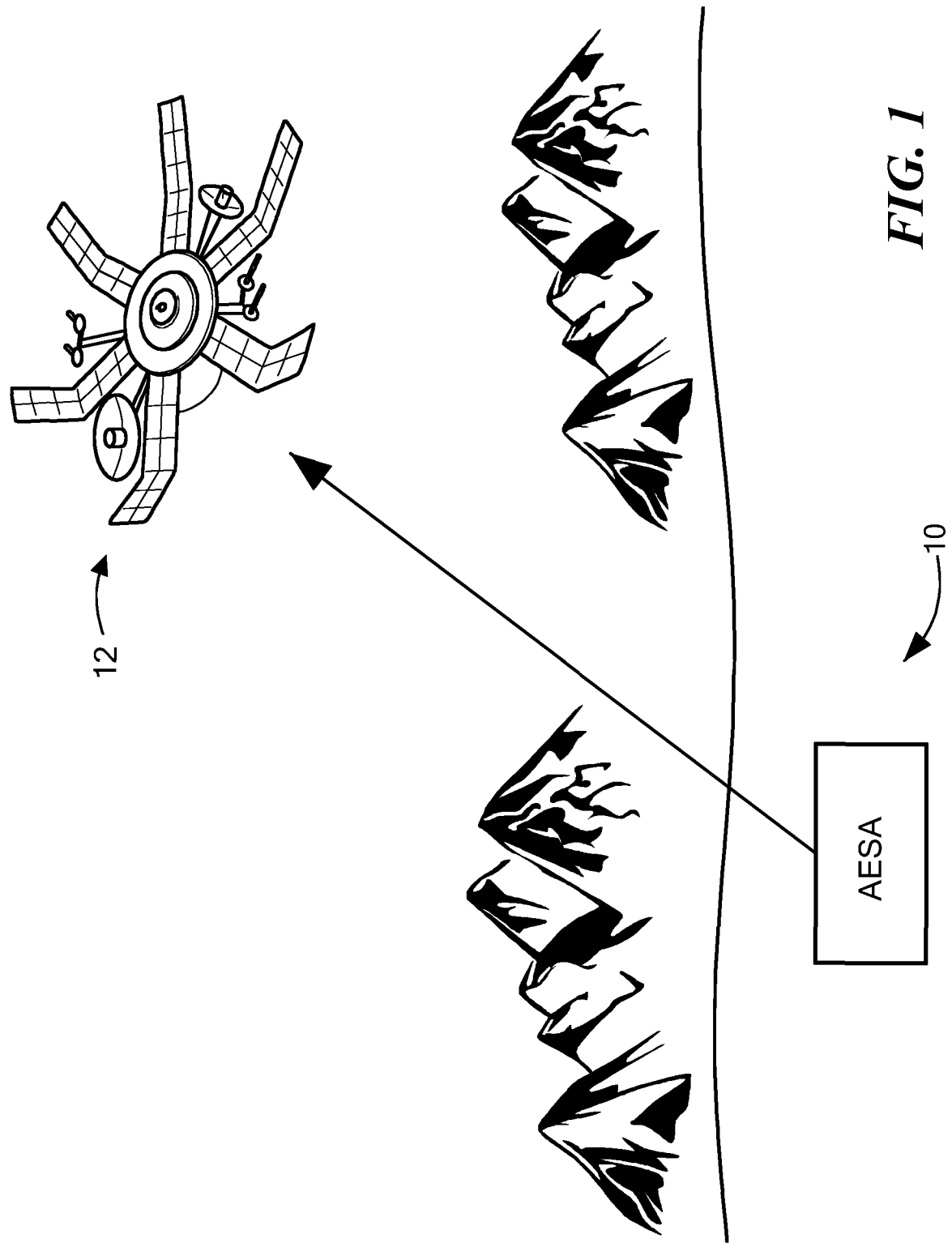
FIG. 1 schematically shows an active electronically steered antenna system ("AESA system") configured in accordance with illustrative embodiments of the invention and communicating with a satellite.

FIG. 1 schematically shows an active electronically steered antenna system ("AESA system 10") configured in accordance with illustrative embodiments of the invention and communicating with an orbiting satellite 12. A phased array (discussed below and identified by reference number "10A") implements the primary functionality of the AESA system 10. Specifically, as known by those skilled in the art, the phased array 10A forms one or more of a plurality of electronically steerable beams that can be used for a wide variety of applications. As a satellite communication system, for example, the AESA system 10 preferably is configured operate at one or more satellite frequencies. Among others, those frequencies may include the Ka-band, Ku-band, and/or X-band.

The satellite communication system may be part of a cellular network operating under a known cellular protocol, such as the 3G, 4G, or 5G protocols. Accordingly, in addition to communicating with satellites, the system may communicate with earth-bound devices, such as smartphones or other mobile devices, using any of the 3G, 4G, or 5G protocols. As another example, the satellite communication system may transmit/receive information between aircraft and air traffic control systems. Of course, those skilled in the art may use the AESA system 10 (implementing the noted phased array 10A) in a wide variety of other applications, such as broadcasting, optics, radar, etc. Some embodiments may be configured for non-satellite communications and instead communicate with other devices, such as smartphones (e.g., using 4G or 5G protocols). Accordingly, discussion of communication with orbiting satellites 12 is not intended to limit all embodiments of the invention.

Figure 2A:
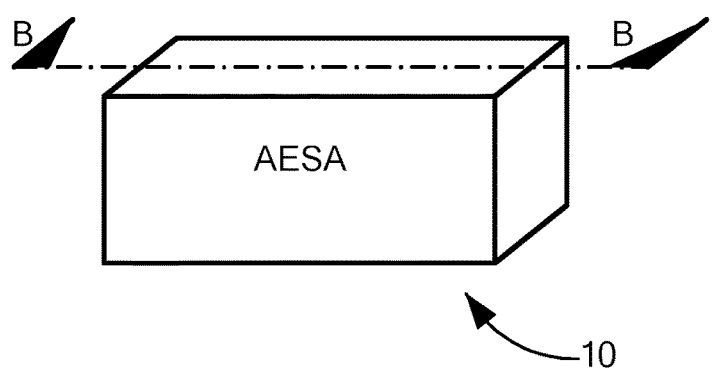
FIGS. 2A and 2B schematically show generalized diagrams of an AESA system that may be configured in accordance with illustrative embodiments of the invention.
Figure 2B:
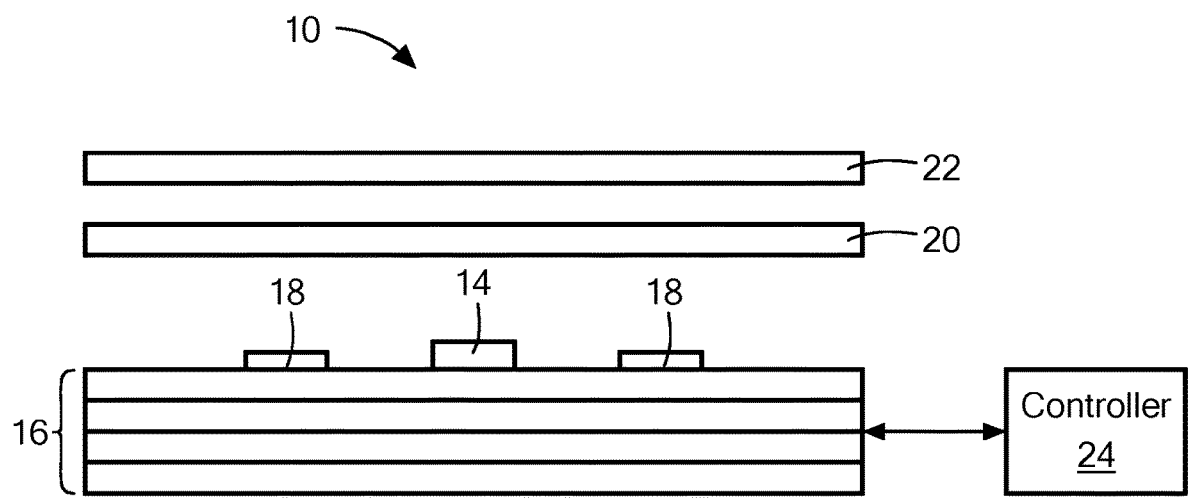

FIGS. 2A and 2B schematically show generalized diagrams of the AESA system 10 configured in accordance with illustrative embodiments of the invention. Specifically, FIG. 2A schematically shows a block diagram of the AESA system 10, while FIG. 2B schematically shows a cross-sectional view of a small portion of the same AESA system 10 across line B-B. This latter view shows a single silicon integrated circuit 14 mounted onto a substrate 16 between two transmit and/or receive elements 18, i.e., on the same side of a supporting substrate 16 and juxtaposed with the two elements 18. In alternative embodiments, however, the integrated circuit 14 could be on the other side/surface of the substrate 16. The phased array 10A also has a polarizer 20 to selectively filter signals to and from the phased array 10A, and a radome 22 to environmentally protect the phased array 10A. A separate antenna controller 24 (FIG. 2B) electrically connects with the phased array 10A to calculate beam steering vectors for the overall phased array 10A, and to provide other control functions.

Figure 3A:
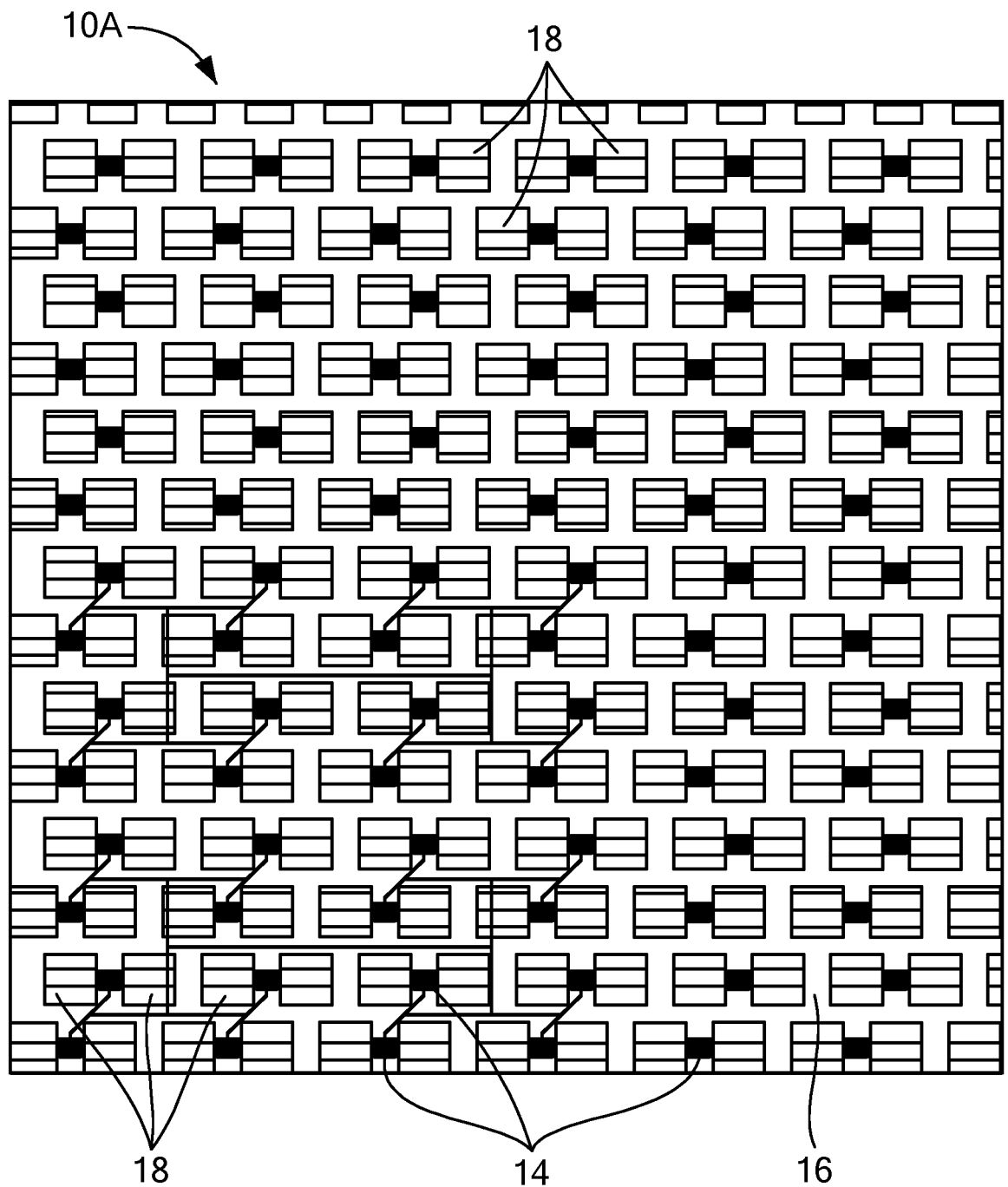
FIG. 3A schematically shows a plan view of a laminar printed circuit board portion of an AESA configured in accordance with illustrative embodiments of the invention.

FIG. 3A schematically shows a plan view of a primary portion of an AESA system 10 that may be configured in accordance with illustrative embodiments of the invention. In a similar manner, FIG. 3B schematically shows a close-up of a portion of the phased array 10A of FIG. 3A.

Specifically, the AESA system 10 of FIG. 3A is implemented as a laminar phased array 10A having a laminated printed circuit board 16 (i.e., acting as the substrate and also identified by reference number "16") supporting the above noted plurality of elements 18 and integrated circuits 14. The elements 18 preferably are formed as a plurality of square or rectangular patch antennas oriented in a triangular patch array configuration. In other words, each element 18 forms a triangle with two other adjacent elements 18—they are not aligned both in rows and columns. From the perspective of FIG. 3A, the elements 18 are aligned in rows but staggered in the Y direction (i.e., columns). When compared to a rectangular lattice configuration, this triangular lattice configuration requires fewer elements 18 (e.g., about 15 percent fewer in some implementations) for a given grating lobe free scan volume. Other embodiments, however, may use other lattice configurations, such as a pentagonal configuration or a hexagonal configuration. Moreover, despite requiring more elements 18, some embodiments may use a rectangular lattice configuration. Like other similar phased arrays, the printed circuit board 16 also may have a ground plane (not shown) that electrically and magnetically cooperates with the elements 18 to facilitate operation.

Figure 3B:
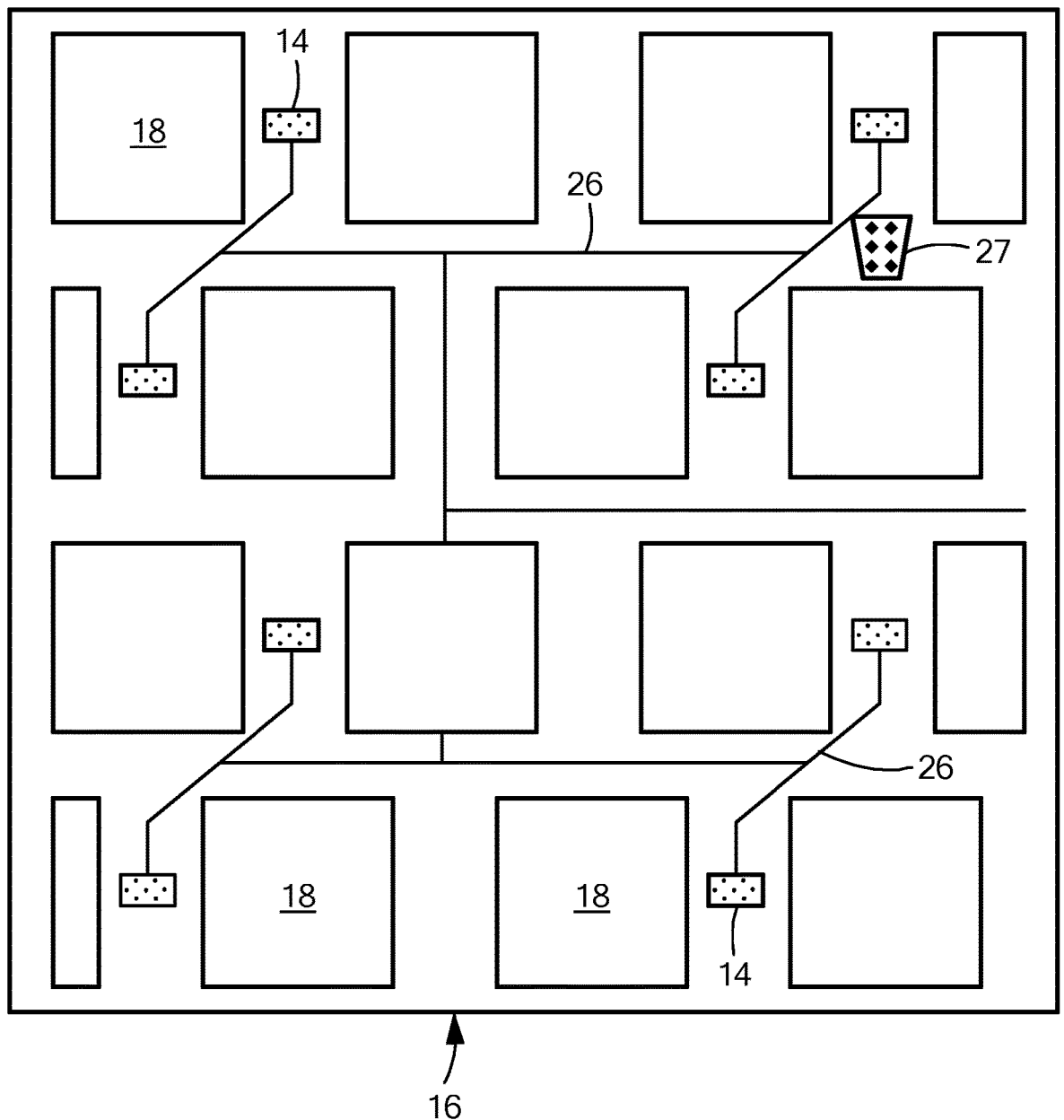
FIG. 3B schematically shows a close-up of a portion of the laminated printed circuit board of FIG. 3A.

Indeed, the array shown in FIGS. 3A and 3B is a small phased array 10A. Those skilled in the art can apply principles of illustrative embodiments to laminar phased arrays 10A with hundreds, or even thousands of elements 18 and integrated circuits 14. In a similar manner, those skilled in the art can apply various embodiments to smaller phased arrays 10A.

Figure 5:
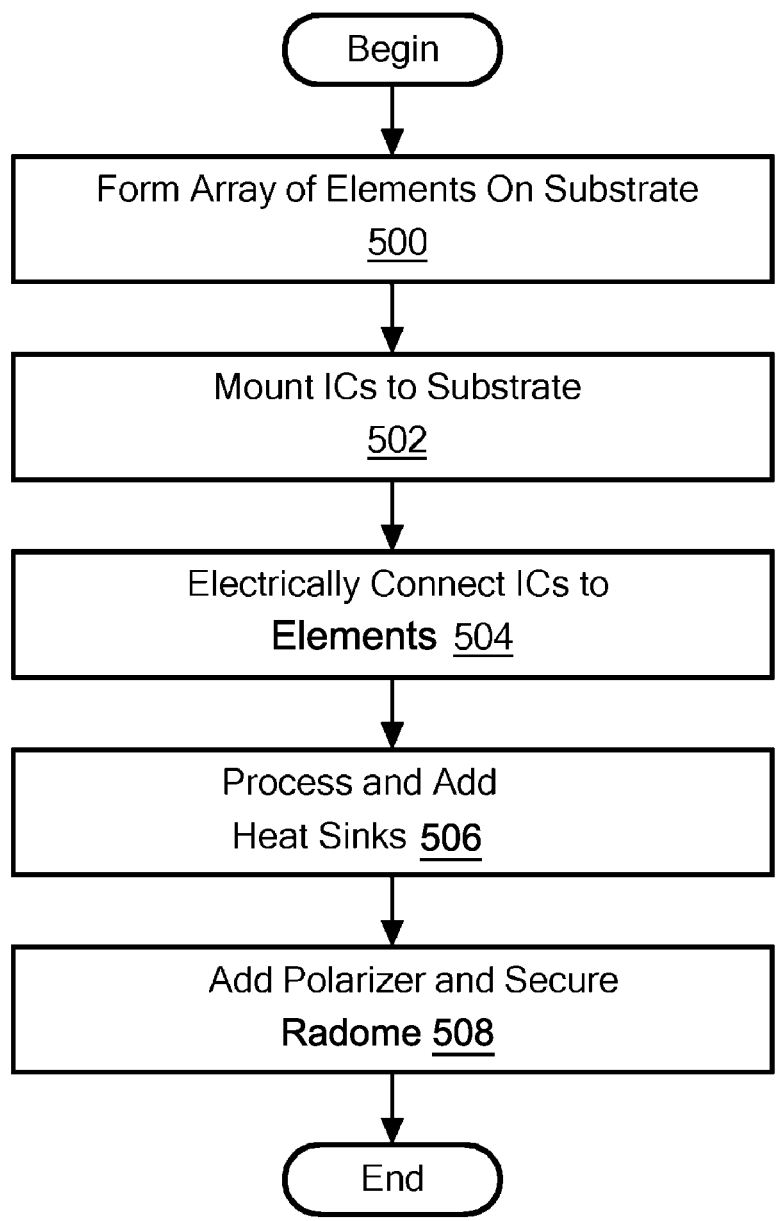
FIG. 5 shows a process of forming an AESA system in accordance with illustrative embodiments of the invention.

As a patch array, the elements 18 have a low profile. Specifically, as known by those skilled in the art, a patch antenna (i.e., the element 18) typically is mounted on a flat surface and includes a flat rectangular sheet of metal (known as the patch and noted above) mounted over a larger sheet of metal known as a "ground plane." A dielectric layer between the two metal regions electrically isolates the two sheets to prevent direct conduction. When energized, the patch and ground plane together produce a radiating electric field. As discussed below with regard to FIG. 5, illustrative embodiments may form the patch antennas using conventional semiconductor fabrication processes, such as by depositing one or more successive metal layers on the printed circuit board 16. Accordingly, using such fabrication processes, each radiating element 18 in the phased array 10A should have a very low profile.

The phased array 10A can have one or more of any of a variety of different functional types of elements 18. For example, the phased array 10A can have transmit-only elements 18, receive-only elements 18, and/or dual mode receive and transmit elements 18 (referred to as "dual-mode elements 18"). The transmit-only elements 18 are configured to transmit outgoing signals (e.g., burst signals) only, while the receive-only elements 18 are configured to receive incoming signals only. In contrast, the dual-mode elements 18 are configured to either transmit outgoing burst signals, or receive incoming signals, depending on the mode of the phased array 10A at the time of the operation. Specifically, when using dual-mode elements 18, the phased array 10A can be in either a transmit mode, or a receive mode. The noted controller 24 at least in part controls the mode and operation of the phased array 10A, as well as other array functions.

The AESA system 10 has a plurality of the above noted integrated circuits 14 (mentioned above with regard to FIG. 2B) for controlling operation of the elements 18. Those skilled in the art often refer to these integrated circuits 14 as "beam steering integrated circuits." In preferred embodiments, these integrated circuits operate at high frequencies—i.e., about 10 gigahertz and higher (e.g., 10 gigahertz to 90 gigahertz, or higher) and are referred to herein as "mm-wave" frequencies.

Each integrated circuit 14 preferably is configured with at least the minimum number of functions to accomplish the desired effect. Indeed, integrated circuits 14 for dual mode elements 18 are expected to have some different functionality than that of the integrated circuits 14 for the transmit-only elements 18 or receive-only elements 18. Accordingly, integrated circuits 14 for such non-dual-mode elements 18 typically have a smaller footprint than the integrated circuits 14 that control the dual-mode elements 18. Despite that, some or all types of integrated circuits 14 fabricated for the phased array 10A can be modified to have a smaller footprint.

As an example, depending on its role in the phased array 10A, each integrated circuit 14 may include some or all of the following functions:
  phase shifting,
  amplitude controlling/beam weighting,
  switching between transmit mode and receive mode,
  output amplification to amplify output signals to the elements 18,
  input amplification for received RF signals (e.g., signals received from the satellite 12), and
  power combining/summing and splitting between elements 18.

Indeed, some embodiments of the integrated circuits 14 may have additional or different functionality, although illustrative embodiments are expected to operate satisfactorily with the above noted functions. Those skilled in the art can configure the integrated circuits 14 in any of a wide variety of manners to perform those functions. For example, the input amplification may be performed by a low noise amplifier, the phase shifting may use conventional active phase shifters, and the switching functionality may be implemented using conventional transistor-based switches.

As noted above, the AESA system 10 preferably communicates with one or more orbiting satellites 12 and thus, uses satellite frequencies for that communication. Accordingly, the plurality of integrated circuits 14 preferably are configured operate the phased array 10A at one or more frequencies of the Ka-band, Ku-band, and/or X-band to communicate with at least one satellite 12. Of course, as satellite communication technology progresses, future implementations may modify the frequency bands of the integrated circuits 14 to communicate using new satellite frequencies.

In some embodiments, multiple elements 18 share the integrated circuits 14, thus reducing the required total number of integrated circuits 14. To that end, each integrated circuit 14 preferably operates on at least one element 18 in the array. For example, one integrated circuit 14 can operate on two or four different elements 18. Of course, those skilled in the art can adjust the number of elements 18 sharing an integrated circuit 14 based upon the application. For example, a single integrated circuit 14 can control two elements 18, three elements 18, five elements 18, six elements 18, seven elements 18, eight elements 18, etc., or some range of elements 18. Sharing the integrated circuits 14 between multiple elements 18 in this manner reduces the required total number of integrated circuits 14, correspondingly reducing the required size of the printed circuit board 16.

As noted above, the dual-mode elements 18 may operate in a transmit mode, or a receive mode. To that end, the integrated circuits 14 may generate time division diplex or duplex waveforms so that a single aperture or phased array 10A can be used for both transmitting and receiving. In a similar manner, some embodiments may eliminate a commonly included transmit/receive switch in the side arms of the integrated circuit 14. Instead, such embodiments may duplex at the element 18. This process can be performed by isolating one of the elements 18 between transmit and receive by an orthogonal feed connection.

RF interconnect and/or beam forming lines 26 electrically connect the integrated circuits 14 to their respective elements 18. To further minimize the feed loss, illustrative embodiments mount the integrated circuits 14 as close to their respective elements 18 as possible. Specifically, this close proximity preferably reduces RF interconnect line lengths, reducing the feed loss. To that end, each integrated circuit 14 preferably is packaged either in a flip-chipped configuration using wafer level chip scale packaging (WLCSP), or a traditional package, such as quad flat no-leads package (QFN package). While other types of packaging may suffice, WLCSP techniques are preferred to minimize real estate on the substrate 16.

It should be reiterated that although FIGS. 3A and 3B show the AESA system 10 with some specificity (e.g., the layout of the elements 18 and integrated circuits 14), those skilled in the art may apply illustrative embodiments to other implementations. For example, as noted above, each integrated circuit 14 can connect to more or fewer elements 18, or the lattice configuration can be different. Accordingly, discussion of the specific configuration of the AESA system 10 of FIG. 3A (and other figures) is for convenience only and not intended to limit all embodiments.

Figure 4A:
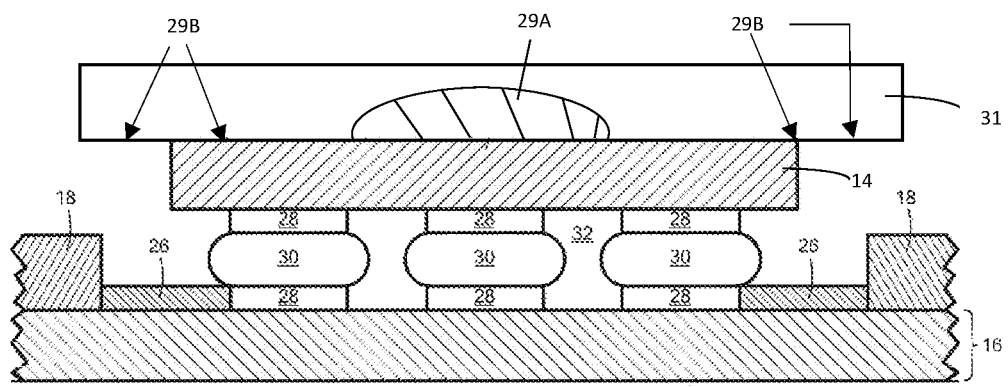
FIG. 4A schematically shows a cross-sectional view of the laminated printed circuit board of 3A to highlight the mounting of its integrated circuits and its heat sink.

FIG. 4A schematically shows a cross-sectional view of the layout of components on the laminated printed circuit board 16 of 3A to highlight the flip-chip mounting of its integrated circuits 14 and its thermal management. The integrated circuit 14 in this drawing intentionally is enlarged to show details of a flip-chip mounting technique. Unlike techniques that permit input/output ("I/O") only on the edge of the integrated circuit 14, flip-chip mounting permits I/O on interior portions of the integrated circuit 14. It should be noted that flip-chip mounting is but one way to form the system. Those skilled in the art can use other techniques for packaging/mounting the integrated circuit 14. Accordingly, discussion of flip-chip mounting is exemplary and not intended to limit various embodiments of the invention.

As shown, the integrated circuit 14 has a plurality of pads 28 (on one side—its "front side") aligned with a plurality of corresponding pads 28 on the printed circuit board 16. These opposing pads 28 on the integrated circuit 14 and the printed circuit board 16 may be considered to form pairs of pads 28. Solder 30 (e.g., solder balls) electrically connect each of the pads in corresponding pairs of pads 28. Interconnect lines, traces, and other electrical interconnects on/in the printed circuit board 16 (e.g., lines 26) thus permit the integrated circuit 14 to communicate with other elements 18 through this electrical interface.

The embodiment shown in FIG. 4A forms a space or void (identified by reference number "32") between the bottom of the integrated circuit 14 (from the perspective of this drawing) and the top surface of the printed circuit board 16. This space 32 may remain an open void—containing no material. Some embodiments may take advantage of this extra space 32 to add further components, such as additional circuit elements, without requiring more circuit board space. Alternatively, this space 32 may contain fill material (not shown) for further stability and thermal management of the integrated circuit 14.

In accordance with illustrative embodiments, for thermal management purposes, a heat sink 31 having a specially configured bottom side (from the perspective of FIG. 4A) is coupled to the back side of the integrated circuit 14. To that end, the bottom side of the heat sink 31 has an aperture region 29A and another region ("first region 29B"). The first region 29B may be generally planar/flat to conform with the back side of the integrated circuit 14. More generally, the first region 29B preferably has a complimentary contour/topology to that of the back side of the integrated circuit 14 to facilitate thermal conduction. The heat sink 31 may be formed from any of a variety of conventional materials commonly used with heat sinks, such as metal.

A thermally conductive adhesive or other material may physically connect the heat sink 31 with the integrated circuit 14 to form a thermal conductive connection. To that end, the thermally conductive adhesive may couple the first region 29B to the back side of the integrated circuit 14 to form a thermally conductive and physical connection. In addition or alternatively, thermal grease may be positioned between the integrated circuit 14 and the heat sink 31 to facilitate thermal conduction. Accordingly, when connected, heat generated by the integrated circuit 14 conducts through the thermal grease and/or adhesive (as the case may be) and into the heat sink 31. As a large thermal mass, the heat sink 31 preferably dissipates the heat to its environment. To further improve integrated circuit cooling, some embodiments may direct the output of a blower or fan (not shown) toward the heat sink.

The aperture region 29A preferably forms a concavity that mitigates electromagnetic interference ("EMI," at least in part produced by the heat sink 31) from impacting the performance of the integrated circuit 14. As such, the aperture region 29A effectively forms an EMI barrier that at least partially shields the integrated circuit 14 from EMI. One skilled in the art may configure this EMI barrier to provide the requisite amount of EMI mitigation as required by the application and anticipated high frequencies of the integrated circuit 14. For example, the EMI barrier may mitigate 90%, 80%, 70% or some other amount of EMI caused by the heat sink 31—minimizing its impact on the integrated circuit 14. This aperture 29A is more than a mere dimple—it extends a non-negligible distance into the body of the heat sink 31, such as between 5 percent and 75 percent of the total die thickness.

Preferably, the aperture region 29A forms one or more concavities (e.g., one concavity, two concavities, or more). For example, as shown in FIG. 4A, the concavity may have a generally elliptical shape having an inner concavity surface that is spaced from the back side of the integrated circuit 14. Other embodiments may form the concavity to be non-elliptical, such as with an irregular inner contour/shape. These concavities may be spaced inwardly from the outer periphery of the heat sink 31. Some embodiments, however, may form the aperture region 29A and one or more of its concavity/concavities to be adjacent to the periphery of the heat sink 31.

The inner concavity surface may form an open space between it and the back side of the integrated circuit 14. Some embodiments permit it to remain as an open space/void. Other embodiments, however, may fill it with a material, such as thermal grease or other thermally conductive material.

It should be noted that some embodiments couple one heat sink 31 per integrated circuit 14. Other embodiments, however, may couple one heat sink 31 to a plurality of integrated circuits 14. Accordingly, discussion of a single heat sink 31 with a single integrated circuit 14 is for illustrative purposes only. This embodiment of the heat sink 31 may have a plurality of apertures 29A so that two or more of the integrated circuits 14 it cools also may have EMI mitigation.

Alternative embodiments, however, still may use similar integrated circuits 14, but not use flip-chip mounting techniques (as noted above). Instead, other mounting techniques may couple the integrated circuits 14 with the substrate 16. Among other things, those techniques may incorporate surface mounting, or wirebond mounting with the integrated circuit 14 rotated 180 degrees from the orientation of FIG. 4A. Accordingly, discussion of flip chip mounting techniques is but one of a variety of different techniques that may be used with various embodiments of the invention.

Figure 4B:
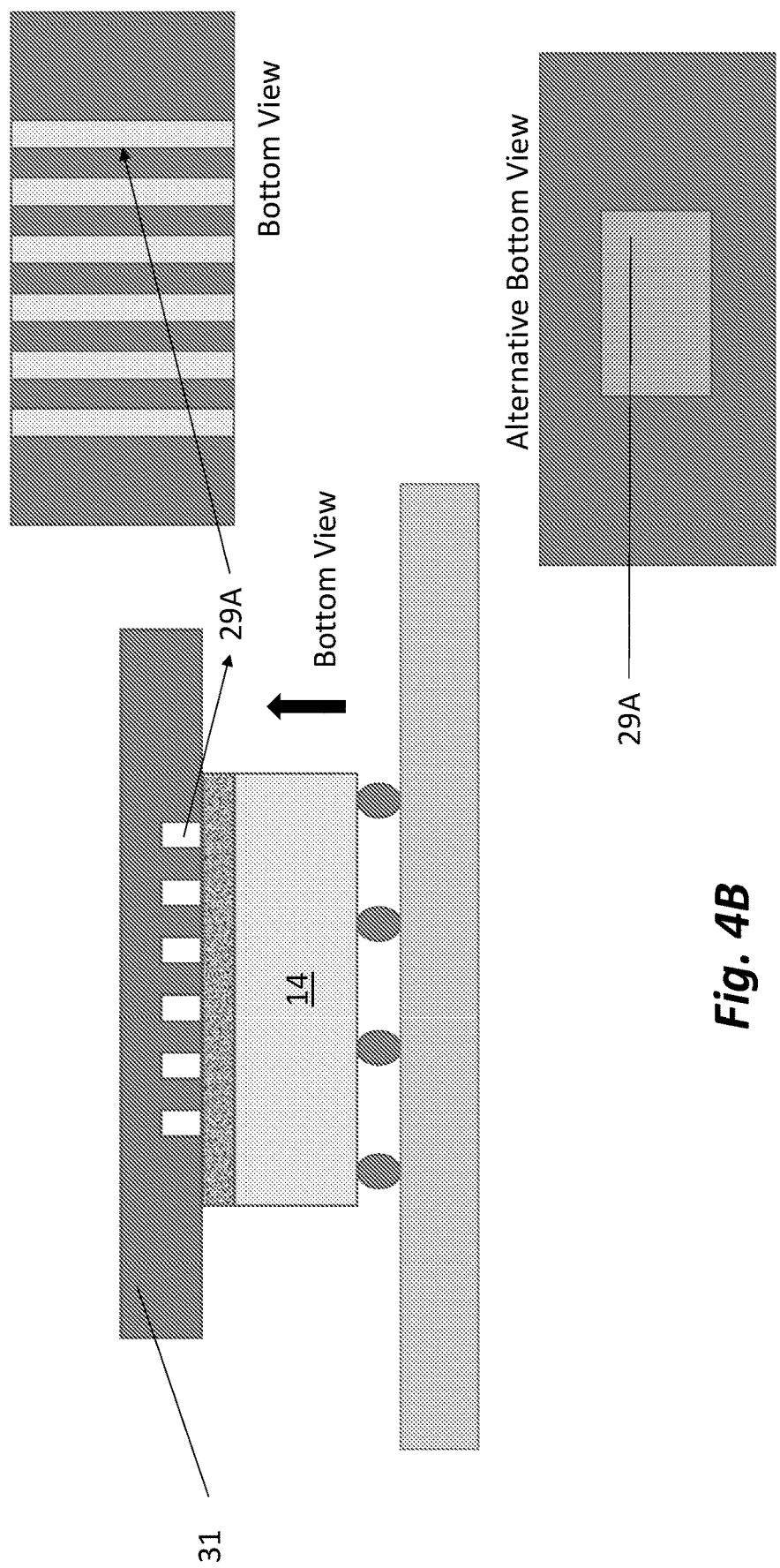
FIG. 4B schematically shows additional embodiments of the invention.

The aperture region 29A may pattern or otherwise form the bottom of the heat sink to have certain concavities/discontinuities beyond those shown above. For example, FIG. 4B shows another embodiment in which the aperture region 29A includes serrated slots. Note that although the bottom view shows the slot extending vertically upwardly, they may extend horizontally instead of vertically. Some embodiments may have both horizontal and vertical serrated slots simultaneously, or some other intersecting design. Those skilled in the art may form the aperture region 29A in any of a variety of other ways for reducing the coupling. FIG. 4B also shows a rectangular concavity instead of a rounded concavity. In addition, these shapes may be right angled or form gradual curves on their interior surfaces.

FIG. 5 shows a process of forming the phased array 10A/AESA system 10 in accordance with illustrative embodiments of the invention. It should be noted that this process is substantially simplified from a longer process that normally would be used to form the AESA system 10. Accordingly, the process of forming the AESA system 10 is expected to have many steps, such as testing steps, soldering steps, or passivation steps, which those skilled in the art may use.

In addition, some of the steps may be performed in a different order than that shown, or at the same time. Those skilled in the art therefore can modify the process as appropriate. Moreover, as noted above and below, the discussed materials and structures are merely examples. Those skilled in the art can select the appropriate materials and structures depending upon the application and other constraints. Accordingly, discussion of specific materials and structures is not intended to limit all embodiments.

Also, FIG. 5 discusses using batch processes to form the phased array 10A. For example, in certain steps, multiple heat sinks 31 may be coupled with multiple integrated circuits 14 at the same time. Those skilled in the art can apply these batch processes to non-batch processes.

The process of FIG. 5 begins at step 500, which forms the array of elements 18 on the substrate 16/printed circuit board 16. As noted above, the elements 18 preferably are formed from metal deposited onto the substrate 16 in a triangular lattice. This step also may form pads 28 and transmission lines 26 on the printed circuit board 16 to extend to the elements 18 (from the pads 28). As discussed below, these lines 26 electrically connect the integrated circuits 14 with the elements 18.

In preferred embodiments, the elements 18 are spaced apart from each other as a function of the wavelength of the signals expected to be transmitted and received by the AESA system 10. For example, the distances between the elements 18 may be spaced apart a distance equal to between 40-60 percent of the wavelength of the relevant signals. Some embodiments, however, may vary the spacing of the elements 18.

Those skilled in the art can select the appropriate numbers of elements 18, based upon the application. Specifically, a given application may require a specified minimum equivalent isotropically radiated power ("EIRP") for transmitting signals. In addition, that same application may have a specified minimum G/T for receiving signals. Thus, step 500 may form the array to have a minimum number of elements 18 to meet either or both the EIRP and the G/T requirements of the application. For example, after establishing the feed loss and the noise figure of the receive amplifier 40 of the vector receive arms 36, one in the art can set the array size to a desired G/T. Of course, the phased array 10A may have more elements 18 beyond that minimum number.

Other embodiments may use other requirements for selecting the appropriate number of elements 18. Accordingly, discussion of the specific means for selecting the appropriate number of elements 18, and their spacing, is for descriptive purposes only and not intended to limit various embodiments of the invention.

At step 502, the process mounts the integrated circuits 14 to the printed circuit board 16/substrate 16. To that end, as noted above, when using WLCSP integrated circuits 14, illustrative embodiments may use conventional flip-chip mounting processes. Such a process directly electrically connects the integrated circuits 14 to the elements 18 (step 504). To that end, such embodiments may deposit solder paste (e.g., powdered solder and flux) on the pads 28 of the printed circuit board 16, and position the integrated circuits 14 on their respective board pads 28. Then, the printed circuit board 16 may be heated (e.g., using a reflow oven or process) to physically and electrically couple the pads 28 with the solder 30.

Some embodiments that do not use flip-chip mounted WLCSP integrated circuits 14, however, may require the additional step of step 504 to electrically connect the integrated circuits 14 to the elements 18. For example, a wirebond operation may be required to solder wirebonds between the integrated circuits 14 and the elements 18.

Next, step 506 processes the heat sinks to form the aperture region 29A. Those skilled in the art may use conventional processes to form the appropriately shaped and configured concavity or concavities. For example, some embodiments may machine the concavity from a metal heat sink 31. Other embodiments may use chemical processes to form the concavity or concavities. This step then couples the heat sinks 31 to the back sides of the integrated circuits 14. For example, a conductive adhesive may be applied to the back sides of the integrated circuits 14, and the heat sinks 31 correspondingly placed onto those back sides. As another example, a conductive adhesive may be applied to the first portions 29B of the heat sinks, and the heat sinks 31 correspondingly may be placed onto the back sides of the integrated circuits 14.

The process concludes by adding the polarizer 20 and securing the radome 22 (step 508) to the apparatus in a conventional manner.

Accordingly, the inventors discovered that specially configured heat sink 31 enables effective thermal management of high frequency integrated circuits 14 while minimizing electromagnetic interference.

Although the above discussion discloses various exemplary embodiments of the invention, it should be apparent that those skilled in the art can make various modifications that will achieve some of the advantages of the invention without departing from the true scope of the invention.

What is claimed is:

1. An integrated circuit system comprising:
a die containing high frequency circuitry operating at mm-wave frequencies, the die also having a first side and a second side;
a plurality of interfaces on the first side, the plurality of interfaces being in electrical communication with the high frequency circuitry; and
a heat sink having a bottom surface with a first region and an aperture region, the first region being in physical and conductive contact with the die, the aperture region forming a concavity with an inner concave surface that is spaced from the die.

2. The integrated circuit system of claim 1 wherein the aperture region is adjacent to the second side.

3. The integrated circuit system of claim 1 wherein the aperture region forms a concavity having an elliptical shape.

4. The integrated circuit system of claim 1 wherein the aperture region forms a concavity having an irregular shape.

5. The integrated circuit system of claim 1 wherein the aperture region forms a concavity having a non-elliptical shape.

6. The integrated circuit system of claim 1 wherein the first region is substantially planar.

* * * * *